US012563937B2

(12) United States Patent
Huang et al.

(10) Patent No.: US 12,563,937 B2
(45) Date of Patent: Feb. 24, 2026

(54) PIXEL STRUCTURES, FINE METAL MASKS, DISPLAY APPARATUSES AND CONTROL METHODS

(71) Applicants: Chengdu BOE Optoelectronics Technology Co., Ltd., Sichuan (CN); BOE Technology Group Co., Ltd., Beijing (CN)

(72) Inventors: Yan Huang, Beijing (CN); Jianpeng Wu, Beijing (CN); Qian Xu, Beijing (CN); Guomeng Zhang, Beijing (CN); Tong Niu, Beijing (CN); Jianbo Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 404 days.

(21) Appl. No.: 17/921,931

(22) PCT Filed: Oct. 22, 2021

(86) PCT No.: PCT/CN2021/125605
§ 371 (c)(1),
(2) Date: Oct. 27, 2022

(87) PCT Pub. No.: WO2022/116730
PCT Pub. Date: Jun. 9, 2022

(65) Prior Publication Data
US 2023/0292568 A1 Sep. 14, 2023

(30) Foreign Application Priority Data
Dec. 1, 2020 (CN) .......................... 202011386284.4

(51) Int. Cl.
*H10K 59/35* (2023.01)
*C23C 14/04* (2006.01)
(Continued)

(52) U.S. Cl.
CPC ......... *H10K 59/353* (2023.02); *C23C 14/042* (2013.01); *C23C 14/24* (2013.01);
(Continued)

(58) Field of Classification Search
CPC .. H10K 59/353; H10K 71/166; H10K 59/352; H10K 71/164
See application file for complete search history.

(56) References Cited

U.S. PATENT DOCUMENTS

2016/0351116 A1\* 12/2016 Sun ................... G02F 1/134309
2020/0135123 A1 4/2020 Hu et al.
2024/0212599 A1\* 6/2024 Wang ................... G09G 3/3233

FOREIGN PATENT DOCUMENTS

CN 106449710 A 2/2017
CN 104465714 B 4/2017
(Continued)

OTHER PUBLICATIONS

CN 202011386284.4 first office action dated Nov. 29, 2024.
PCT/CN2021/125605 international search report.
PCT/CN2021/125605 Written Opinion.

*Primary Examiner* — Joseph L Williams
(74) *Attorney, Agent, or Firm* — IPro, PLLC

(57) ABSTRACT

Provided are a pixel structure, a fine metal mask, a display apparatus and a control method. The pixel structure includes: a plurality of first sub-pixel columns, where the first sub-pixel column includes a plurality of first sub-pixels arranged along a first direction, and two adjacent first sub-pixel columns are separated by a second sub-pixel column. The second sub-pixel column includes a plurality of second sub-pixel groups, the second sub-pixel group
(Continued)

includes a second sub-pixel and a third sub-pixel, and along the first direction, the second sub-pixels and the third sub-pixels in the second sub-pixel column are arranged alternately, and the first sub-pixel is configured to form a pixel unit with two second sub-pixel groups for displaying.

20 Claims, 5 Drawing Sheets

(51) Int. Cl.
  *C23C 14/24*         (2006.01)
  *G09G 3/3225*       (2016.01)
  *H10K 71/16*         (2023.01)
(52) U.S. Cl.
  CPC ......... *G09G 3/3225* (2013.01); *H10K 71/166* (2023.02); *G09G 2340/0457* (2013.01)

(56)                    References Cited

FOREIGN PATENT DOCUMENTS

CN        107967886  A      4/2018
CN        109212819  A      1/2019
CN        109509779  A      3/2019
CN        210073853  U      2/2020
CN        112436048  A      3/2021
CN        214588856  U     11/2021
KR      20160018936  A      2/2016

* cited by examiner

First direction

First direction

First direction

PIXEL STRUCTURES, FINE METAL MASKS, DISPLAY APPARATUSES AND CONTROL METHODS

CROSS-REFERENCE TO RELATED APPLICATIONS

This application is a US national phase of international PCT Application No. PCT/CN2021/125605, filed on Oct. 22, 2021, which claims priority to Chinese patent application No. 2020113862844 filed with the Chinese Patent Office on Dec. 1, 2020, the entire contents of which are incorporated herein by reference for all purposes.

TECHNICAL FIELD

The present application relates to the field of display technologies, and in particular to a pixel structure, a fine metal mask, a display apparatus and a control method.

BACKGROUND

As people have increasingly more and diverse requirements for the display effect of electronic devices, organic light-emitting display panels have become a major research direction in the display field due to wide color gamut, high contrast, lightweight, portability, etc. A structure of organic light-emitting diode (OLED) display device includes a substrate, a light-emitting layer, an encapsulation layer, etc., where the light-emitting layer is sub-pixels arranged in array on the substrate. Along with continuous social progress, people have higher and higher requirements for resolutions of display apparatuses. Limited by the existing process level and manufacturing costs, it is difficult to effectively further improve the resolutions of the display apparatuses.

Hence, improvements are to be made for the existing pixel structure, fine metal mask, display apparatus and control method.

SUMMARY

The present application is made by the inventor based on discovery and recognition for the following facts and problems.

Sub-pixels on a substrate of an organic light-emitting display panel are usually formed through evaporation process. During evaporation, organic light-emitting materials with different luminous characteristics are deposited onto corresponding sub-pixel positions of the substrate by a fine metal mask (FMM). Based on comprehensive consideration of process level and manufacturing costs, it is difficult to improve the resolution of the display apparatuses by reducing pixel pitch or inter-pixel distance at present. In the present application, the inventor finds that, by using the sub-pixels at some positions shared by different pixels, higher resolution performance can be achieved by using fewer sub-pixels.

The present application aims to mitigate or solve at least one of the above problems to some extent.

According to an aspect of the present application, the present application provides a pixel structure for an organic light-emitting display panel, including: a plurality of first sub-pixel columns, where the first sub-pixel column includes a plurality of first sub-pixels arranged along a first direction, and two adjacent first sub-pixel columns are spaced apart by one or more second sub-pixel columns; the second sub-pixel column includes a plurality of second sub-pixel groups, the second sub-pixel group comprises a second sub-pixel and a third sub-pixel, and along the first direction, the second sub-pixels and the third sub-pixels in each of the second sub-pixel columns are arranged alternately, and the first sub-pixel is configured to form a pixel unit with two second sub-pixel groups for displaying. When the pixel structure of the organic light-emitting display panel is disposed in the above manner, the display effect of the organic light-emitting display panel can be effectively improved by allowing the second sub-pixel groups to share the first sub-pixels.

In an embodiment of the present application, along a direction perpendicular to the first direction, the first sub-pixel columns and the second sub-pixel columns are alternately arranged, and two adjacent second sub-pixel groups in a same column form one pixel unit with a same first sub-pixel. In this way, the display performance of the display substrate can be improved further.

In an embodiment of the present application, the second sub-pixel and the third sub-pixel in a same second sub-pixel group have a same width along the direction perpendicular to the first direction. A distance between the first sub-pixels and either of the two second sub-pixel groups is $D1$, a distance between the second sub-pixel and the third sub-pixel in the same second sub-pixel group is $D2$, the distances $D2$ in the pixel structure are all equal, and a distance between two adjacent second sub-pixel groups in a same column is $D3$; the pixel structure satisfies that $D1$, $D2$ and $D3$ are all equal. Hence, the display effect of the organic light-emitting display panel can be further improved.

In an embodiment of the present application, along a direction perpendicular to the first direction, the first sub-pixel columns and the second sub-pixel columns are alternately arranged, and two second sub-pixel groups located at both sides of one first sub-pixel along the direction perpendicular to the first direction share the first sub-pixel to form a pixel unit. In this way, the display performance of the display substrate can be improved further.

In an embodiment of the present application, the second sub-pixel and the third sub-pixel in a same second sub-pixel group have unequal widths along the direction perpendicular to the first direction; the distance between the first sub-pixels and either of the two second sub-pixel groups is $D1$, the distance between the second sub-pixel and the third sub-pixel along the first direction in the same second sub-pixel group is $D2$, the distances $D2$ in the pixel structure are all equal, the distance between two adjacent second sub-pixel groups in a same column is $D3$, and $D1$, $D2$ and $D3$ are all equal. Hence, the display effect of the organic light-emitting display panel can be further improved.

In an embodiment of the present application, the first sub-pixels are blue sub-pixels. Hence, the display accuracy of color of the organic light-emitting display panel can be further improved.

In an embodiment of the present application, the second sub-pixels are red sub-pixels, and the third sub-pixels are green sub-pixels. Hence, the service life of the organic light-emitting display panel can be further improved.

In an embodiment of the present application, the sub-pixels are in a shape of rectangle, diamond, triangle, hexagon, circle or ellipse. Thus, the space utilization rate of the display substrate can be further improved.

According to another aspect of the present application, the present application provides a fine metal mask for forming the above pixel structure, including a mask matrix, where the mask matrix is made of a metal and has a plurality of apertures for forming the sub-pixels of the pixel structure, and each type of the apertures is used to form sub-pixels of one color. Hence, the above pixel structure can be formed by using the fine metal mask and thus the display effect of the organic light-emitting display panel having the above pixel structure can be improved further.

In an embodiment of the present application, two adjacent columns of the first sub-pixels in the pixel structure are spaced apart by one column of the second sub-pixel groups, and an area of each of the apertures for forming the first sub-pixels corresponds to an area of two or more first sub-pixels; or, two adjacent columns of the first sub-pixels in the pixel structure are spaced apart by two columns of the second sub-pixel groups, and an area of each of the apertures for forming sub-pixels in the second sub-pixel groups corresponds to an area of two or more sub-pixels. In this way, the preparation difficulty of the fine metal mask can be reduced and the process flow of preparing the sub-pixels is simplified, thus helping speed up the manufacturing process of the organic light-emitting display panel.

In an embodiment of the present application, shapes of the apertures and the sub-pixels are rectangular. Therefore, it facilitates to form a plurality of sub-pixel structures of uniform shape in one evaporation process, thus further improving the manufacturing process of the organic light-emitting display panel.

According to another aspect of the present application, the present application provides a display apparatus, including the above pixel structure. Thus, the display apparatus has all features and advantages that the above pixel structure has, and no redundant descriptions are made herein.

According to another aspect of the present application, the present application provides a method of controlling the above display apparatus. Each first sub-pixel in the display apparatus is configured to form a pixel unit with two second sub-pixel groups for displaying. The method includes: based on contents to be displayed by the pixel unit to which the two second sub-pixel groups belong, inputting a first data signal to the first sub-pixel, where the first data signal is processed using a sub-pixel rendering technology; and based on the contents to be displayed by the pixel unit, inputting a second data signal to the second sub-pixels and the third sub-pixels in the second sub-pixel groups respectively. Thus, by allowing the second sub-pixel groups to share the first sub-pixels, higher resolution performance can be achieved using fewer sub-pixels.

BRIEF DESCRIPTION OF THE DRAWINGS

The above and/or additional aspects of the present application will become apparent and understandable from the descriptions of the embodiments in combination with the following drawings.

DESCRIPTIONS OF REFERENCE NUMERALS IN THE DRAWINGS

Figure 1:
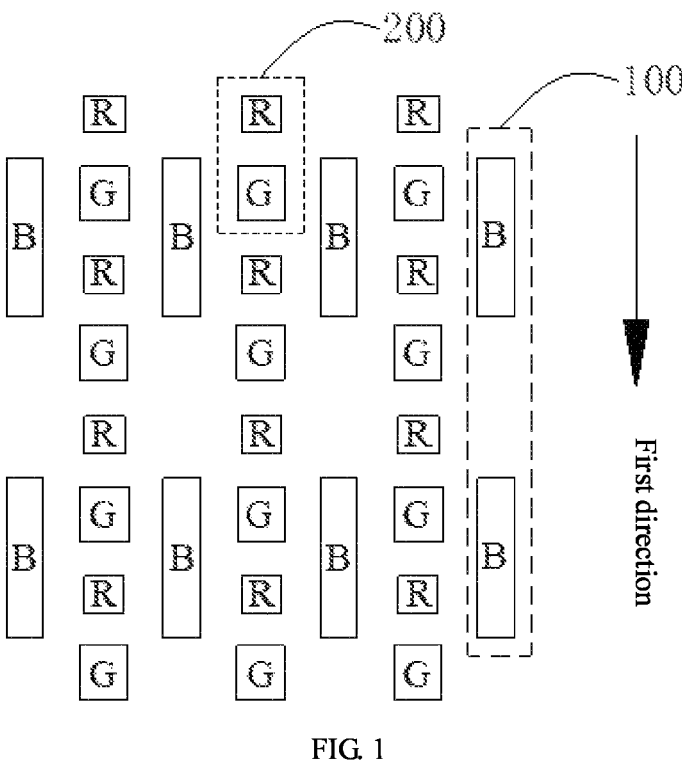
FIG. 1 is a structural schematic diagram illustrating a pixel structure according to an embodiment of the present application.

100: first sub-pixel column; 200: second sub-pixel group.

DETAILED DESCRIPTION OF THE EMBODIMENTS

The embodiments of the present application will be detailed with examples of the embodiments illustrated in the accompanying drawings, and same or similar symbols represent same or similar elements or elements with same or similar functions throughout the specification. The embodiments described below by referring to the drawings are merely illustrative and used only to explain the present application and shall not be understood as limiting of the present application.

Figure 3:
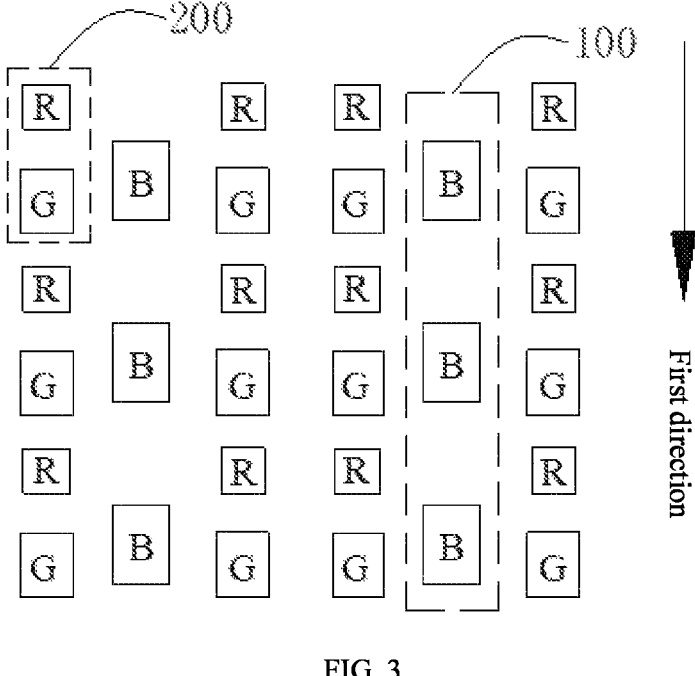
FIG. 3 is a structural schematic diagram illustrating a pixel structure according to another embodiment of the present application.

According to an aspect of the present application, as shown in FIGS. 1 and 3, the present application provides a pixel structure for an organic light-emitting display panel, including: a plurality of first sub-pixel columns 100, where the first sub-pixel columns 100 each include a plurality of first sub-pixels arranged along a first direction, and two adjacent first sub-pixel columns 100 are separated by one or more second sub-pixel columns. The second sub-pixel columns each include a plurality of second sub-pixel groups 200, where the second sub-pixel group 200 includes a second sub-pixel and a third sub-pixel, and along the first direction, the second sub-pixels and the third sub-pixels in the second sub-pixel column are arranged alternately, and the first sub-pixel is configured to form a pixel unit with two second sub-pixel groups 200 for displaying. For example, the first sub-pixels are blue sub-pixels B, and the second sub-pixel groups each include a red sub-pixel R and a green sub-pixel G When a picture is displayed, the red sub-pixel and the green sub-pixel in each second sub-pixel group may form one light-emitting pixel point with their adjacent first sub-pixel, i.e. a blue sub-pixel. A display effect of displaying in a higher resolution with a lower physical resolution can be achieved based on color borrowing principle between sub-pixels.

In some embodiments of the present application, as shown in FIG. 1, an arrangement manner of the second sub-pixel groups 200 is not specifically limited. For example, along a direction perpendicular to the first direction, the first sub-pixel columns and the second sub-pixel columns are alternately arranged, and two adjacent second sub-pixel groups in a same column form a pixel unit with a same first sub-pixel. When the second sub-pixel groups are arranged as above, two adjacent second sub-pixel groups in a same column form a pixel unit with a same first sub-pixel, that is, during displaying, two adjacent second sub-pixel groups in a same column and the same first sub-pixel serve as two light-emitting pixel points for displaying, thereby effectively improving the display resolution.

Figure 2:
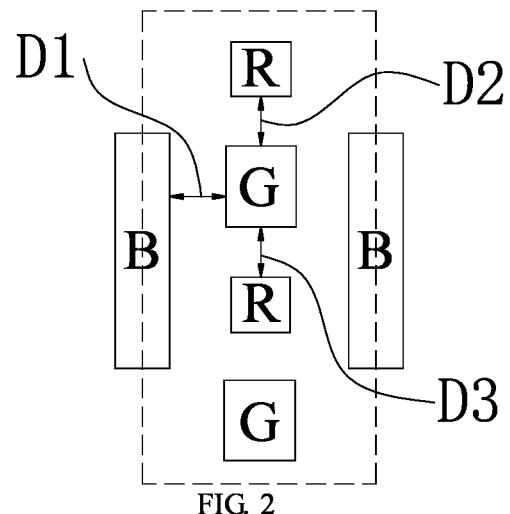
FIG. 2 is a partial structural schematic diagram illustrating a pixel structure according to an embodiment of the present application.

In some embodiments of the present application, as shown in FIG. 2, widths of the second sub-pixel and the third sub-pixel in one same second sub-pixel group along the direction perpendicular to the first direction are not specifically limited. For example, the widths of the second sub-pixel and the third sub-pixel along the direction perpendicular to the first direction in one same second sub-pixel group may be equal. When the widths of the second sub-pixel and the third sub-pixel along the direction perpendicular to the first direction in one same second sub-pixel group are equal, apertures in a fine metal mask for forming the second sub-pixels and the third sub-pixels through evaporation process are simple with the apertures having a width equal to the width of the second sub-pixel and the third sub-pixel along the direction perpendicular to the first direction. Thus, process difficulty is reduced and product yield is improved. In some embodiments of the present application, a distance between the first sub-pixels and the second sub-pixel groups is D1, a distance between the second sub-pixel and the third sub-pixel in one same second sub-pixel group is D2, and a distance between two adjacent second sub-pixel groups in a same column is D3. The size relationship of D1, D2 and D3 is not specifically limited, for example, the distances D2 at different positions in the pixel structure are all equal, or the distances D1, D2 and D3 may all be equal in the pixel structure. When the distances D2 at different positions in the pixel structure are equal, namely, the distances between the second sub-pixels and the third sub-pixels having different colors in the second sub-pixel groups are maintained equal, a procedure for manufacturing a fine metal mask used in evaporation process is relatively simple and process difficulty is also low, which facilitates to obtain a fine metal mask with a fineness satisfying use requirements. Furthermore, that the distances between the second sub-pixels and the third sub-pixels having different colors in the second sub-pixel groups are maintained equal helps improve a space utilization rate of the display substrate. The distances D1, D2 and D3 in the pixel structure being all equal facilitates manufacturing of the fine metal mask used in evaporation process and improves the space utilization rate of the display substrate. Thus, on a condition of no reduction in accuracy of display effect, the area of the smallest pixel unit (represented by a dotted line box in FIG. 2) can be further reduced and the display resolution of the display panel can be further improved.

In some embodiments of the present application, as shown in FIG. 3, the arrangement manner of the second sub-pixel groups 200 is not specifically limited. For example, along the direction perpendicular to the first direction, the first sub-pixel columns and the second sub-pixel columns are alternately arranged, and two second sub-pixel groups located at both sides of one same first sub-pixel along the direction perpendicular to the first direction share one first sub-pixel to form a pixel unit. When the second sub-pixel groups are arranged as above, two second sub-pixel groups located at both sides of one same first sub-pixel along the direction perpendicular to the first direction share one first sub-pixel to form a pixel unit, that is, during displaying, two second sub-pixel groups located at both sides of one same first sub-pixel along the direction perpendicular to the first direction and one first sub-pixel between the two second sub-pixel groups serve as two light-emitting pixel points for displaying, thus effectively improving the display resolution.

Figure 4:
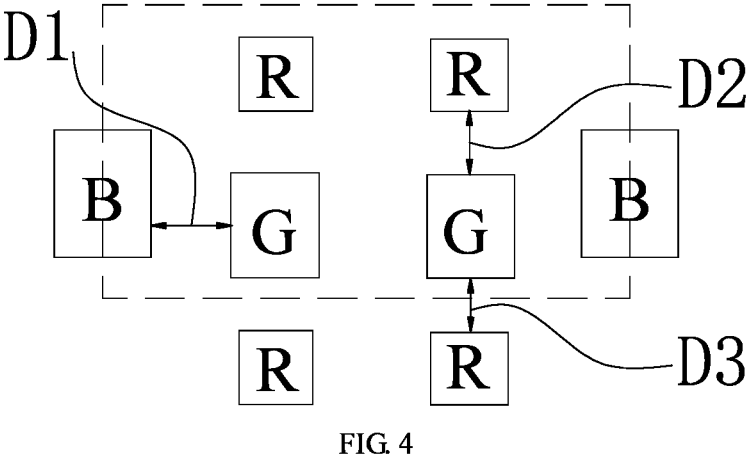
FIG. 4 is a partial structural schematic diagram illustrating a pixel structure according to another embodiment of the present application.

In some embodiments of the present application, as shown in FIG. 4, the widths of the second sub-pixel and the third sub-pixel along the direction perpendicular to the first direction in one same second sub-pixel group are not specifically limited. For example, the widths of the second sub-pixel and the third sub-pixel along the direction perpendicular to the first direction in one same second sub-pixel group may be unequal. The distance between the first sub-pixels and the second sub-pixel groups is D1, the distance between the second sub-pixel and the third sub-pixel along the first direction in one same second sub-pixel group is D2, and the distance between two second sub-pixel groups in a same column is D3. The size relationship of D1, D2 and D3 is not specifically limited, for example, the distances D2 at different positions in the pixel structure are all equal, or the distances D1, D2 and D3 may all be equal in the pixel structure. When the distances D2 at different positions in the pixel structure are equal, namely, the distances between the second sub-pixels and the third sub-pixels having different colors in the second sub-pixel groups are maintained equal, a procedure for manufacturing a fine metal mask used in evaporation process is relatively simple and process difficulty is also low, which facilitates to obtain a fine metal mask with a fineness satisfying use requirements. Furthermore, that the distances between the second sub-pixels and the third sub-pixels having different colors in the second sub-pixel groups are maintained equal helps improve the space utilization rate of the display substrate. The distances D1, D2 and D3 in the pixel structure being all equal facilitates manufacturing of the fine metal mask used in evaporation process and improves the space utilization rate of the display substrate. Thus, on a condition of no reduction in accuracy of display effect, an area of the smallest pixel unit (represented by a dotted line box in FIG. 4) can be further reduced and the display resolution of the display panel can be further improved.

For ease of understanding, the principle on which the pixel structure can achieve the above beneficial effects will be briefly described below.

Figure 5:
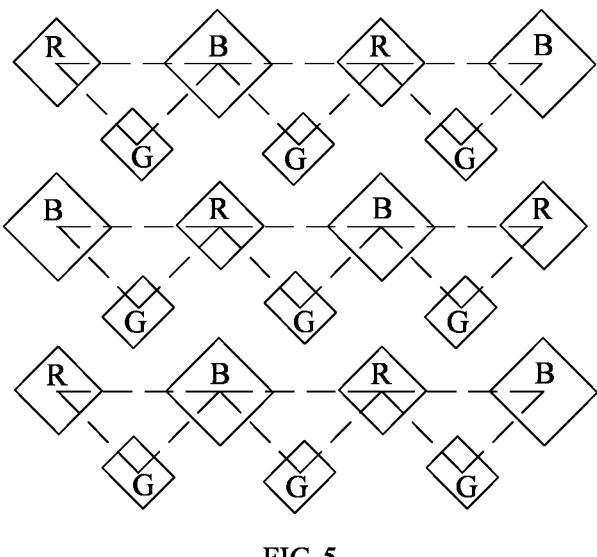
FIG. 5 is a pixel sharing principle diagram of one pixel structure in related arts.

As shown in FIG. 5, in a diamond pixel structure in related arts, only green sub-pixels correspondingly express a green signal in a true RGB whereas red and blue signals are to be emitted by red sub-pixels and blue sub-pixels based on sub-pixel rendering technology. The sub-pixel rendering technology refers to a technology by which a sensory resolution is improved by allowing adjacent pixels to share some sub-pixels, such that a higher sensory resolution can be achieved for a display in a case of same sub-pixel arrangement density, or in a case of maintaining the same sensory resolution unchanged, the requirement for the arrangement density of the sub-pixels of the display is lowered. In the diamond pixel structure, based on the algorithm of sharing of the left-right adjacent virtual pixels of same row, the red signal and the blue signal in the true RGB are represented, that is, for any one light-emitting pixel point, only the green signal is expressed by the green sub-pixels, and the red signal and the blue signal are expressed through simulation based on sub-pixel rendering technology. For a diamond pixel structure, its sub-pixel composition and sub-pixel rendering algorithm can maintain corresponding true RGB pixel (brightness) resolution expression level. In most cases, an acceptable picture expression effect can be obtained. Since the red signal and the blue signal both are based on sub-pixel rendering technology, when a picture with high color accuracy is displayed, color cast may inevitably occur due to shortage of red sub-pixels and green sub-pixels, resulting in loss of partial picture information.

Figure 6:
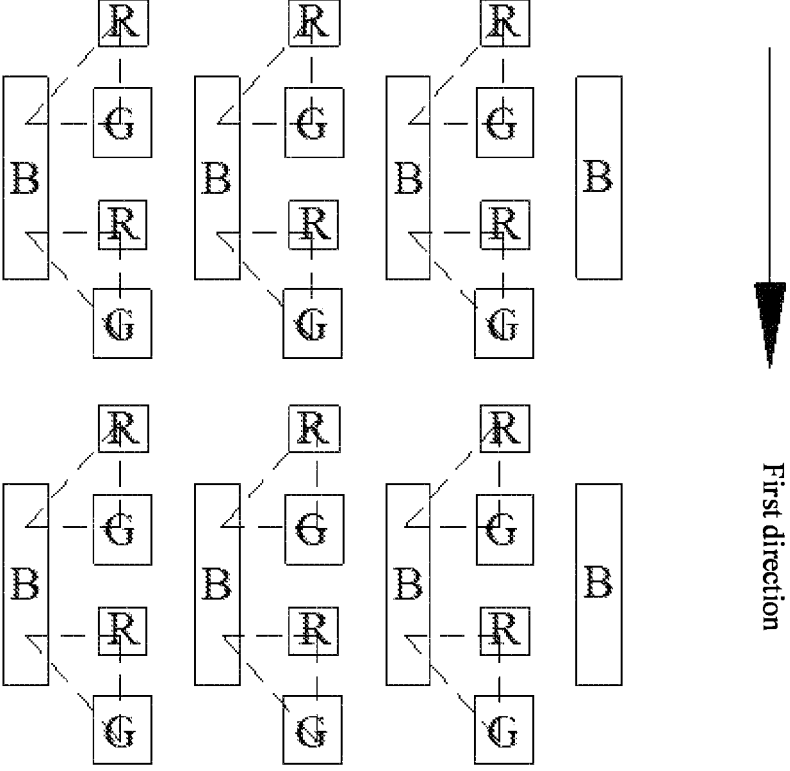
FIG. 6 is a pixel sharing principle diagram of a pixel structure according to an embodiment of the present application.
Figure 7:
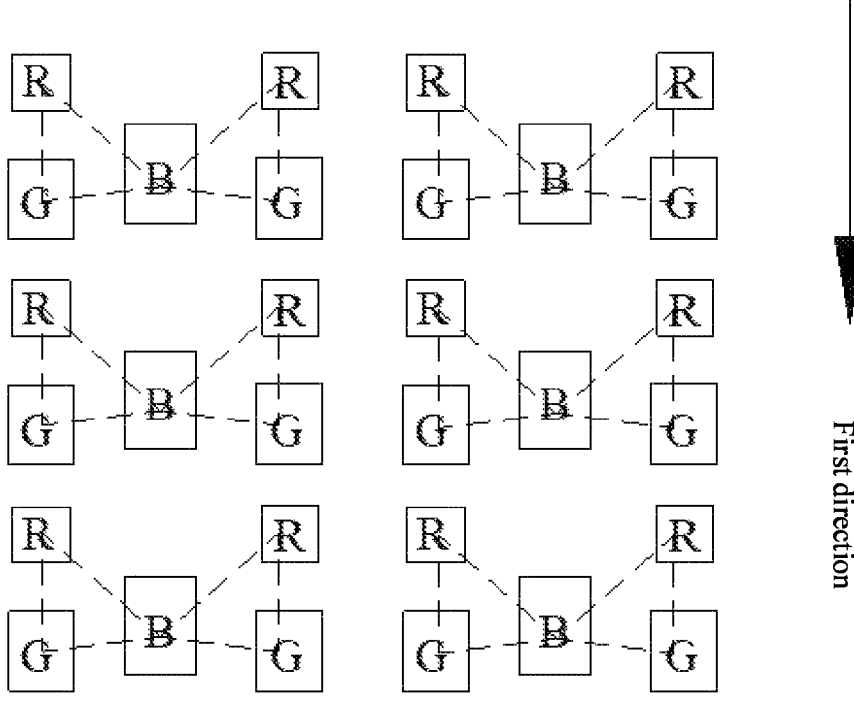
FIG. 7 is a pixel sharing principle diagram of a pixel structure according to another embodiment of the present application.

By referring to FIGS. 6 and 7, the inventor finds that, by reducing the number of sub-pixels using sub-pixel rendering technology, the color accuracy of the displayed picture can be effectively increased and color casts can also be reduced. In the present application, by increasing the number of the sub-pixels directly displaying the true RGB signals and reducing the number of the sub-pixels using the sub-pixel rendering technology, improvement in color accuracy of the displayed picture can be achieved. When only the blue sub-pixels are shared in the pixel structure, the green sub-pixels correspondingly express the green signal in the true RGB, the red sub-pixels correspondingly express the red signal in the true RGB, and the blue sub-pixels need to adopt the sub-pixel rendering technology to emit light, so as to form light-emitting pixel points with adjacent green sub-pixels and red sub-pixels. In this way, the resolution can be increased based on sub-pixel rendering algorithm, and the loss of partial picture information resulting from fewer sub-pixels displaying the true RGB signals can be compensated for. Thus, the display accuracy of color of the light-emitting pixel points can be effectively improved and overall display effect of the display panel can also be improved.

In some embodiments of the present application, colors of the sub-pixels are not specifically limited. For example, the colors of the sub-pixels may include red, green and blue. When the colors of the sub-pixels include red, green and blue, the display panel can display all other colors. In some embodiments of the present application, the colors of the second sub-pixels and the third sub-pixels are not specifically limited. For example, the second sub-pixels may be red sub-pixels, and the third sub-pixels may be green sub-pixels. In some embodiments of the present application, the number of the second sub-pixels and the third sub-pixels in the second sub-pixel group is not specifically limited, for example, the second sub-pixel group may include one second sub-pixel and one third sub-pixel. The sub-pixels in the second sub-pixel group are true pixels which directly display the true RGB signals. Except for the first sub-pixels using the sub-pixel rendering technology, other sub-pixels can be included in the second sub-pixel groups, that is, the number of the sub-pixels in the second sub-pixel group can be adjusted based on actual situations.

In an embodiment of the present application, the color of the first sub-pixels is not specifically limited, for example, the first sub-pixels may be blue sub-pixels. Since each first sub-pixel is shared by two second sub-pixel groups, using blue first sub-pixels as the first sub-pixels has an advantage that the occupation area of the pixel units can be saved. Specifically, due to a short life span of blue light-emitting material, an area of the blue sub-pixels is usually greater than that of the green sub-pixels and the red sub-pixels. Since the organic light-emitting material forming the blue sub-pixels has a luminous efficiency far lower than organic light-emitting materials forming the red sub-pixels and the green sub-pixels, when the red, green and blue sub-pixels of same area emit light of red, green and blue colors of same brightness, it is required to increase a current running through the blue organic light-emitting material. Over a long time of use, lifetime of the blue organic light-emitting material will be attenuated faster, which directly affects the color accuracy of the display panel. By increasing the area of the blue sub-pixels, the current running through the blue organic light-emitting material during light emission can be reduced so as to retard the attenuation in light-emitting lifetime of the blue organic light-emitting material. Hence, when the blue sub-pixels are used as the first sub-pixels, the blue sub-pixels with relatively large occupation area are located in the first sub-pixel column, and the red sub-pixels and the green sub-pixels with relatively equal area form the second sub-pixel groups, thereby saving the entire occupation area of the pixel units.

In some embodiments of the present application, a shape of the sub-pixels is not specifically limited, for example, the shape of the sub-pixels may be rectangle, diamond, triangle, hexagon, circle or ellipse. Those skilled in the art can understand that, for display panels of different shapes, in order to improve space utilization rate of display substrates, the shape of the sub-pixels on the display substrates may not be limited specifically as long as the sub-pixel arrangement density can satisfy use requirements. Therefore, persons skilled in the art can make selection based on actual situations.

Figure 8:
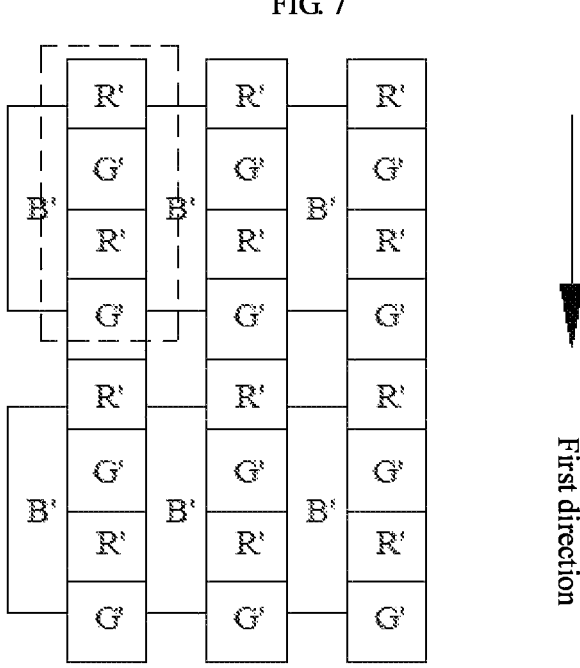
FIG. 8 is a structural schematic diagram illustrating a fine metal mask according to an embodiment of the present application.

According to another aspect of the present application, as shown in FIG. 8, the present application provides a fine metal mask for forming the above pixel structure, including a mask matrix, where the mask matrix is made of a metal and has a plurality of apertures for forming the sub-pixels of the pixel structure, and each type of the apertures is used to form the sub-pixels of one color. With the sub-pixels including RGB colors as an example, in the drawings, B's correspondingly represent apertures for forming the blue sub-pixels, G's correspondingly represent apertures for forming the green sub-pixels, and R's correspondingly represent apertures for forming the red sub-pixels. Hence, a pixel structure prepared using the above fine metal mask has all features and advantages that the above pixel structure has and no redundant descriptions are made herein.

Figure 9:
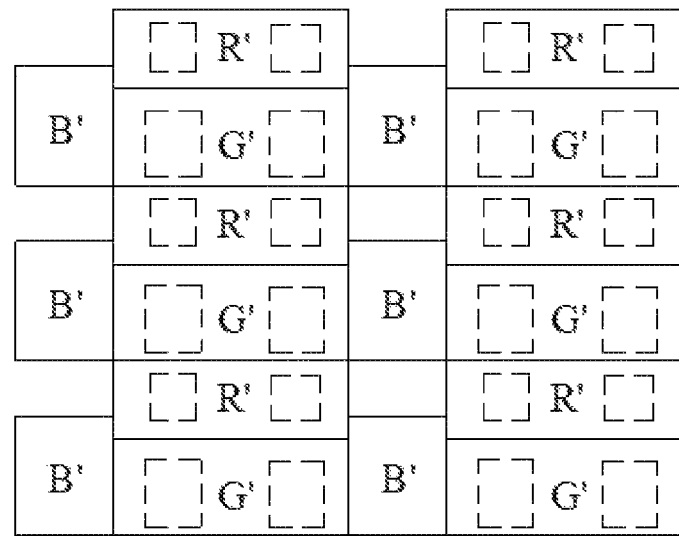
FIG. 9 is a structural schematic diagram illustrating a fine metal mask according to another embodiment of the present application.
Figure 10:
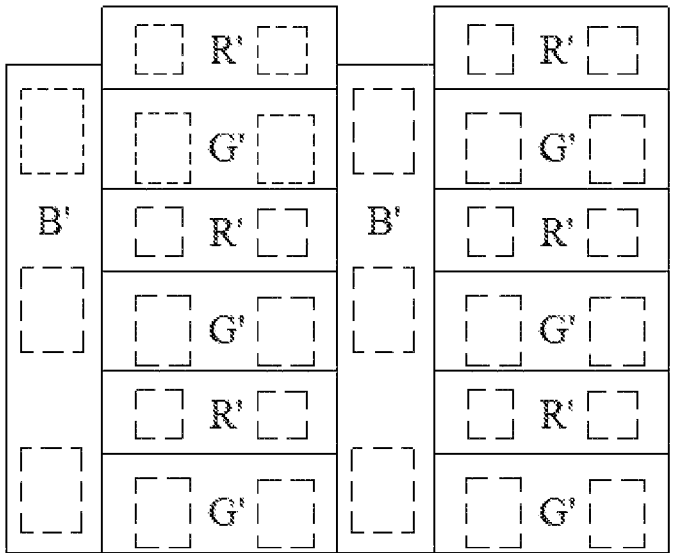
FIG. 10 is a structural schematic diagram illustrating a fine metal mask according to another embodiment of the present application.

In some embodiments of the present application, as shown in FIGS. 9 and 10, when two adjacent columns of first sub-pixels in the pixel structure are separated by one column of second sub-pixel groups, the area of the aperture for forming the first sub-pixels is not specifically limited, for example, the area of the aperture for forming the first sub-pixels may correspond to an area of two or more first sub-pixels. In some embodiments of the present application, when two adjacent columns of first sub-pixels in the pixel structure are separated by two columns of second sub-pixel groups, the area of the aperture for forming the sub-pixels in the second sub-pixel groups is not specifically limited, for example, the area of the aperture for forming the sub-pixels in the second sub-pixel groups may correspond to an area of two or more sub-pixels. The fine metal mask (FMM) functions to form light-emitting pixel points in a production process of an organic light-emitting display panel through deposition of organic light-emitting materials of different colors and the apertures of the fine metal mask directly determine the resolution of the organic light-emitting display panel. The smaller the aperture is, the smaller an area of a single sub-pixel is, the smaller an area of a formed light-emitting pixel point is, and the higher the resolution of the display panel is. However, a production yield of the fine metal masks with small apertures is low, which directly results in significantly increased manufacturing difficulty of the fine metal masks and significantly increased manufacturing costs. Further, in the subsequent evaporation process to form the sub-pixels, a requirement for process accuracy is increased accordingly, which is unfavorable for simplification of process flow and decrease of manufacturing costs. When an area of an aperture for forming a particular type of sub-pixel can correspond to an area of two or more of such sub-pixels, the process difficulty of manufacturing the fine metal masks will be obviously reduced. Furthermore, during an evaporation process, no higher process accuracy is required to deposit corresponding organic light-emitting materials onto corresponding positions. The sub-pixels can be defined and distinguished by a pixel definition layer on the display substrate.

In some embodiments of the present application, a shape of the apertures in the fine metal mask and the shape of the sub-pixels are not limited specifically. For example, the shape of the apertures in the fine metal mask and the shape of the sub-pixels may be rectangle. When the sub-pixels are all rectangular, the fine metal mask is also rectangular, so as to increase the number of the sub-pixels deposited by each aperture and further improve the utilization rate of the apertures in the fine metal masks. Further, the rectangular fine metal masks can be manufactured easily with a high yield.

According to another aspect of the present application, the present application provides a display apparatus, including the above pixel structure. Thus, the display apparatus has all features and advantages that the above pixel structure has and no redundant descriptions are made herein.

According to another aspect of the present application, the present application provides a method of controlling the above display apparatus. Each first sub-pixel in the display apparatus is configured to form a pixel unit with two second sub-pixel groups for displaying. The method includes: based on contents to be displayed by the pixel unit to which the two second sub-pixel groups belong, inputting a first data signal to the first sub-pixel, where the first data signal is processed using sub-pixel rendering technology; based on contents to be displayed by each pixel unit, inputting a second data signal to the second sub-pixels and the third sub-pixels in the second sub-pixel groups respectively. Since the first data signal input to the first sub-pixel is based on the contents to be displayed by the pixel unit to which two second sub-pixel groups belong, that is, the first sub-pixel is shared by the two second sub-pixel groups and the first data signal is a common signal processed using sub-pixel rendering technology, the display brightness of the first sub-pixel can meet the requirement of two adjacent second sub-pixel groups for display brightness of the color corresponding to the first sub-pixels at the same time. Because the second sub-pixels and the third sub-pixels in the second sub-pixel groups directly receive the second data signal, the second sub-pixels and the third sub-pixels can directly display the true RGB signals. By combining the shared first sub-pixels with multiple second sub-pixels and third sub-pixels directly displaying the true RGB signals, higher resolution performance can be achieved using fewer sub-pixels when the display apparatus is controlled using the above method.

In the descriptions of the present application, the orientations or positional relationships indicated by the terms "up" and "down" are based on the orientations or positional relationships shown in the drawings and used to facilitate the description of the present application rather than require the present application to be constructed or operated in a specific orientation and thus shall not be understood as limiting of the present application.

In the descriptions of the specification, the reference terms "one embodiment" and "another embodiment", are intended to mean that the specific features, structures, materials or characteristics described in combination with the embodiments are included in at least one embodiment of the present application. In the specification, the illustrative expressions for the above terms do not necessarily refer to the same embodiments or examples. Furthermore, the described specific features, structures, materials or characteristics can be combined in an appropriate way in any one or more embodiments or examples. Further, in a case of no conflicts, those skilled in the art can perform combination for the different embodiments or examples and the features of the different embodiments or examples described in the specification. In addition, it is to be noted that in the specification, the terms "first" and "second" are used only for the purpose of descriptions and shall not be understood as indicating or implying relative importance or implicitly indicating the number of the indicated technical features.

Although the embodiments of the present application have been described as above, it can be understood that the above embodiments are only illustrative and shall not be understood as limiting of the present application. Those skilled in the art can perform changes, modifications, substitutions or variations to the above embodiments within the scope of the present application.

The invention claimed is:

1. A pixel structure for an organic light-emitting display panel, comprising:
   a plurality of first sub-pixel columns, wherein the first sub-pixel columns each comprise a plurality of first sub-pixels arranged along a first direction, and two adjacent first sub-pixel columns are separated by one or more second sub-pixel columns;
   the one or more second sub-pixel columns each comprise a plurality of second sub-pixel groups, the second sub-pixel groups each comprise a second sub-pixel and a third sub-pixel, and along the first direction, the second sub-pixels and the third sub-pixels in each of the one or more second sub-pixel columns are arranged alternately, and
   each of the first sub-pixels is configured to form a pixel unit with two second sub-pixel groups for displaying.

2. The pixel structure of claim 1, wherein along a direction perpendicular to the first direction, the first sub-pixel columns and the second sub-pixel columns are alternately arranged, and two adjacent second sub-pixel groups in a same column form the pixel unit with a same first sub-pixel.

3. The pixel structure of claim 2, wherein the second sub-pixel and the third sub-pixel in a same second sub-pixel group have a same width along the direction perpendicular to the first direction;
   a distance between the first sub-pixel and either of the two second sub-pixel groups is D1, a distance between the second sub-pixel and the third sub-pixel in the same second sub-pixel group is D2, the distances D2 in the pixel structure are all equal, and a distance between two adjacent second sub-pixel groups in a same column is D3;
   the pixel structure satisfies that D1, D2 and D3 are all equal.

4. The pixel structure of claim 1, wherein along a direction perpendicular to the first direction, the first sub-pixel columns and the second sub-pixel columns are alternately arranged, and two second sub-pixel groups located at both sides of one first sub-pixel along the direction perpendicular to the first direction share the first sub-pixel to form the pixel unit.

5. The pixel structure of claim 4, wherein the second sub-pixel and the third sub-pixel in a same second sub-pixel group have different widths along the direction perpendicular to the first direction;
   a distance between the first sub-pixel and either of the two second sub-pixel groups is D1, a distance between the second sub-pixel and the third sub-pixel along the first direction in the same second sub-pixel group is D2, the distances D2 in the pixel structure are all equal, a distance between two adjacent second sub-pixel groups in a same column is D3, and D1, D2 and D3 are all equal.

6. The pixel structure of claim 5, wherein the first sub-pixels are blue sub-pixels.

7. The pixel structure of claim 6, wherein the second sub-pixels are red sub-pixels, and the third sub-pixels are green sub-pixels.

8. The pixel structure of claim 1, wherein the sub-pixels are in a shape of rectangle, diamond, triangle, hexagon, circle or ellipse.

9. A fine metal mask for forming the pixel structure of claim 1, comprising:

a mask matrix, wherein the mask matrix is made of a metal and has a plurality of apertures for forming the sub-pixels of the pixel structure, and each type of the apertures is used to form sub-pixels of one color.

10. The fine metal mask of claim 9, wherein two adjacent columns of the first sub-pixels in the pixel structure are separated by one column of the second sub-pixel groups, and an area of each of the apertures for forming the first sub-pixels corresponds to an area of two or more first sub-pixels; or, two adjacent columns of the first sub-pixels in the pixel structure are separated by two columns of the second sub-pixel groups, and an area of each of the apertures for forming sub-pixels in the second sub-pixel groups corresponds to an area of two or more sub-pixels.

11. The fine metal mask of claim 10, wherein shapes of the apertures and the sub-pixels are rectangular.

12. A display apparatus, comprising a pixel structure and a driving circuit for the pixel structure, wherein the pixel structure comprises a plurality of first sub-pixel columns, wherein the first sub-pixel columns each comprise a plurality of first sub-pixels arranged along a first direction, and two adjacent first sub-pixel columns are separated by one or more second sub-pixel columns;

the one or more second sub-pixel columns each comprise a plurality of second sub-pixel groups, the second sub-pixel groups each comprise a second sub-pixel and a third sub-pixel, and along the first direction, the second sub-pixels and the third sub-pixels in each of the one or more second sub-pixel columns are arranged alternately, and each of the first sub-pixels is configured to form a pixel unit with two second sub-pixel groups for displaying.

13. A method of controlling a display apparatus, wherein the display apparatus comprises a pixel structure and a driving circuit for the pixel structure, wherein the pixel structure comprises a plurality of first sub-pixel columns, wherein the first sub-pixel columns each comprise a plurality of first sub-pixels arranged along a first direction, and two adjacent first sub-pixel columns are separated by one or more second sub-pixel columns;

the one or more second sub-pixel columns each comprise a plurality of second sub-pixel groups, the second sub-pixel groups each comprise a second sub-pixel and a third sub-pixel, and along the first direction, the second sub-pixels and the third sub-pixels in each of the one or more second sub-pixel columns are arranged alternately, and wherein each of the first sub-pixels in the display apparatus is configured to form a pixel unit with two second sub-pixel groups for displaying, and the method comprises:

based on contents to be displayed by the pixel unit to which the two second sub-pixel groups belong, inputting a first data signal to the first sub-pixel, wherein the first data signal is processed using a sub-pixel rendering technology; and based on the contents to be displayed by the pixel unit, inputting a second data signal to the second sub-pixels and the third sub-pixels in the second sub-pixel groups respectively.

14. The display apparatus of claim 12, wherein along a direction perpendicular to the first direction, the first sub-pixel columns and the second sub-pixel columns are alternately arranged, and two adjacent second sub-pixel groups in a same column form the pixel unit with a same first sub-pixel.

15. The display apparatus of claim 14, wherein the second sub-pixel and the third sub-pixel in a same second sub-pixel group have a same width along the direction perpendicular to the first direction;

a distance between the first sub-pixel and either of the two second sub-pixel groups is D1, a distance between the second sub-pixel and the third sub-pixel in the same second sub-pixel group is D2, the distances D2 in the pixel structure are all equal, and a distance between two adjacent second sub-pixel groups in a same column is D3;

the pixel structure satisfies that D1, D2 and D3 are all equal.

16. The display apparatus of claim 12, wherein along a direction perpendicular to the first direction, the first sub-pixel columns and the second sub-pixel columns are alternately arranged, and two second sub-pixel groups located at both sides of one first sub-pixel along the direction perpendicular to the first direction share the first sub-pixel to form the pixel unit.

17. The display apparatus of claim 16, wherein the second sub-pixel and the third sub-pixel in a same second sub-pixel group have different widths along the direction perpendicular to the first direction;

a distance between the first sub-pixel and either of the two second sub-pixel groups is D1, a distance between the second sub-pixel and the third sub-pixel along the first direction in the same second sub-pixel group is D2, the distances D2 in the pixel structure are all equal, a distance between two adjacent second sub-pixel groups in a same column is D3, and D1, D2 and D3 are all equal.

18. The display apparatus of claim 17, wherein the first sub-pixels are blue sub-pixels.

19. The display apparatus of claim 18, wherein the second sub-pixels are red sub-pixels, and the third sub-pixels are green sub-pixels.

20. The display apparatus of claim 12, wherein the sub-pixels are in a shape of rectangle, diamond, triangle, hexagon, circle or ellipse.

* * * * *